(12) United States Patent
Fernandez-Texon

(10) Patent No.: US 6,473,485 B1
(45) Date of Patent: Oct. 29, 2002

(54) CHARGE PUMP LEAKAGE CURRENT COMPENSATION SYSTEMS AND METHODS

(75) Inventor: Francisco Fernandez-Texon, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/951,161

(22) Filed: Sep. 10, 2001

(51) Int. Cl.[7] .............................................. H03K 21/00
(52) U.S. Cl. .............................. 377/27; 377/2; 377/16; 327/148; 327/151; 327/157; 327/160; 327/362; 327/384; 327/390; 327/536; 327/538
(58) Field of Search ................................. 377/2, 16, 27; 327/148, 151, 157, 160, 362, 384, 390, 536, 538

(56) References Cited

U.S. PATENT DOCUMENTS 5,920,215 A * 7/1999 Drost et al. .................. 327/157

* cited by examiner

*Primary Examiner*—Margaret R. Wambach
(74) *Attorney, Agent, or Firm*—MacPherson Kwok Chen & Heid LLP

(57) ABSTRACT

A leakage current compensation system and method is disclosed that reduces frequency spurs and phase offset in a frequency synthesizer. The leakage current is determined based on the phase offset of the frequency synthesizer relative to a reference clock. A leakage current compensation circuit provides a leakage current compensation signal to the frequency synthesizer at the loop filter terminals to minimize the phase offset.

10 Claims, 6 Drawing Sheets

CHARGE PUMP LEAKAGE CURRENT COMPENSATION SYSTEMS AND METHODS

BACKGROUND OF THE INVENTION

1. Field of the Invention

The present invention relates generally to electrical circuits and, more particularly, to charge pumps.

2. Related Art

Charge pumps are well known in the art. For example, a charge pump is commonly used in a frequency synthesizer, such as a phase-locked loop circuit. One drawback of a typical frequency synthesizer is charge pump leakage current, which contributes to frequency spurs and phase offset at the voltage-controlled oscillator output. For example, current mismatch in the charge pump current sources, due to the finite output impedance of transistors, results in differing current values when subjected to different drain-to-source voltage (e.g., complementary metal-oxide semiconductor technology) or collector-to-emitter voltage (e.g., bipolar junction transistor technology).

There are also other sources of leakage current at the loop filter terminal of a frequency synthesizer. As an example, a common-mode voltage setting circuit or the actual leakage of the filter components contribute to the leakage current.

The leakage current causes the discharge of the loop filter during the off-periods of the charge pump, resulting in a static phase offset between the input signals that drive the phase-frequency detector. The static phase offset is large enough to result in the injection of a charge each reference period, equivalent to the charge that escaped from the loop filter due to the leakage. The injection of charge into the loop filter each reference clock period creates frequency spurs at the voltage-controlled oscillator output.

BRIEF SUMMARY OF THE INVENTION

Charge pump leakage current compensation systems and methods are disclosed herein. The charge pump leakage current compensation architecture reduces frequency spurs and phase offset in a frequency synthesizer by determining and compensating for the leakage current at the loop filter terminal.

In accordance with one embodiment of the present invention, a leakage current compensation circuit includes a frequency synthesizer and a timing circuit coupled to the frequency synthesizer. The timing circuit receives a clock signal from the frequency synthesizer and provides a timing signal indicating the timing of the clock signal relative to a reference clock signal. A counter, coupled to the timing circuit, provides a counter output value based on a value of the timing signal. A digital-to-analog converter, coupled to the counter and to the frequency synthesizer, receives the counter output value and provides a leakage current compensation signal to the frequency synthesizer based on the counter output value.

In accordance with another embodiment of the present invention, a method of compensating for leakage current in a frequency synthesizer includes monitoring a frequency synthesizer to determine when the frequency synthesizer is locked; determining a phase offset of the frequency synthesizer relative to a reference clock when the frequency synthesizer is locked; and supplying a leakage current compensation signal to the frequency synthesizer based on the phase offset determination.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1A:
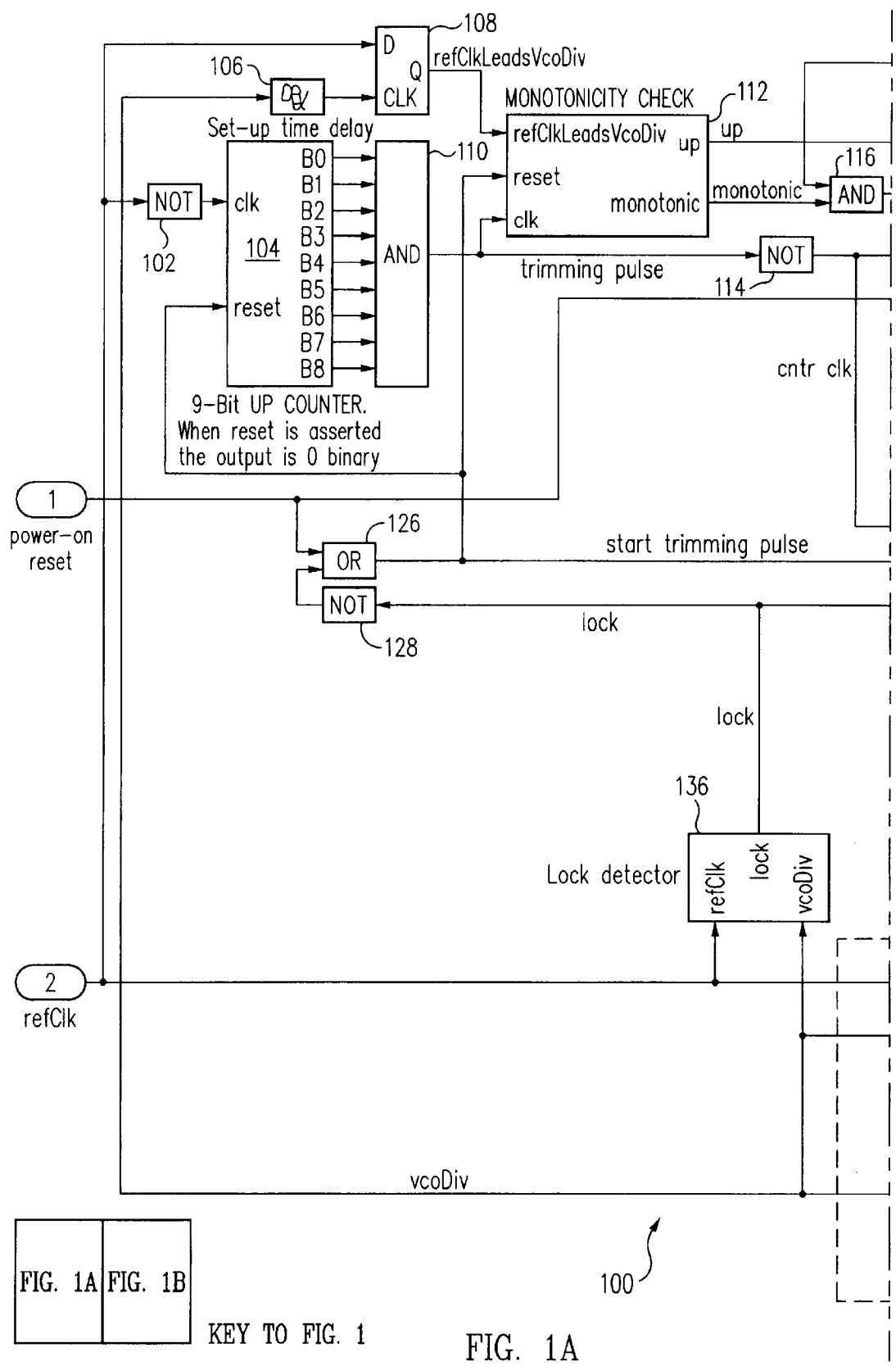
FIG. 1 shows a block diagram illustrating a leakage current compensation circuit for a frequency synthesizer in accordance with an embodiment of the present invention.
Figure 1B:
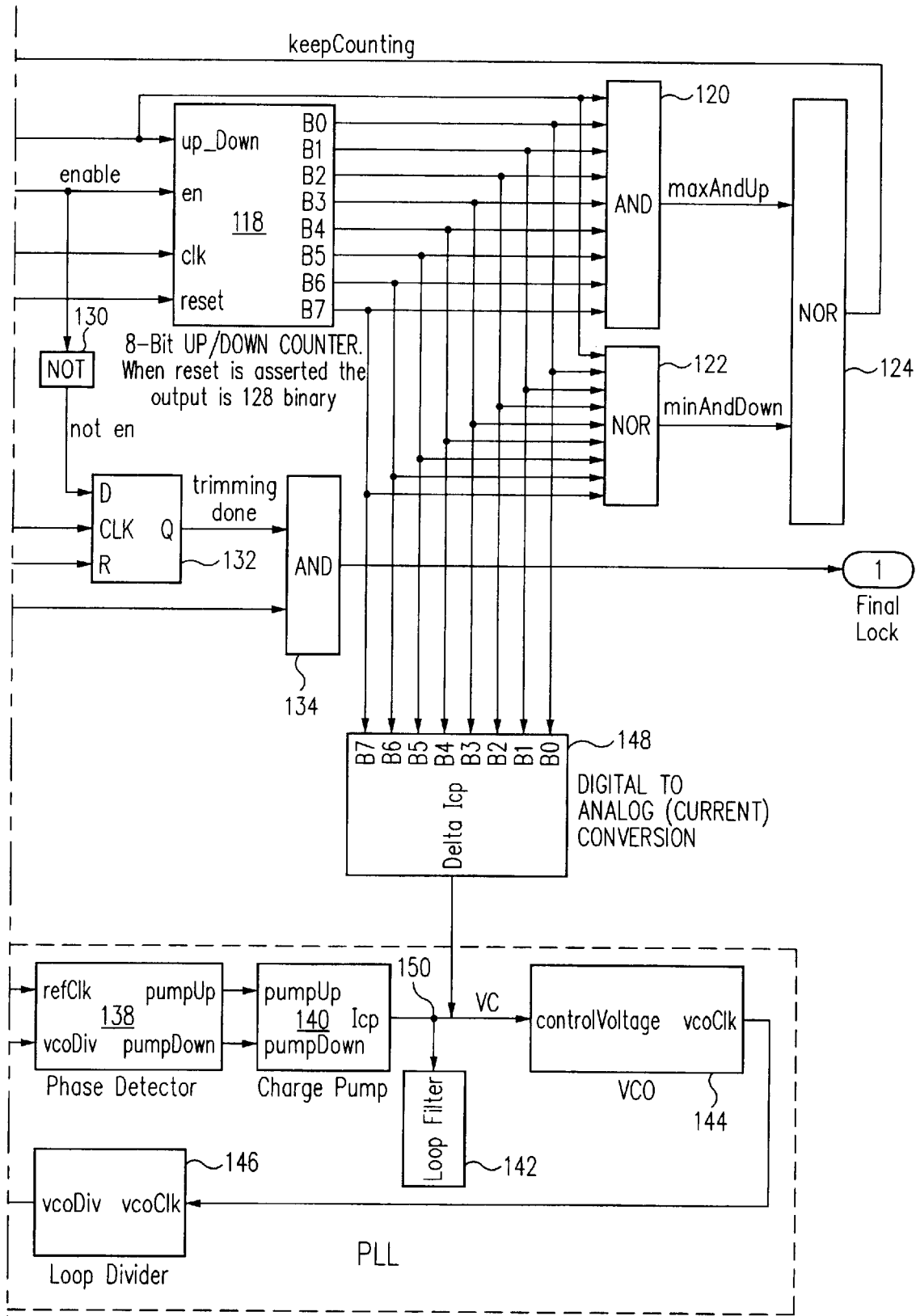

FIG. 1 shows a block diagram illustrating a leakage current compensation circuit 100 for a frequency synthesizer in accordance with an embodiment of the present invention. Leakage current compensation circuit 100 includes logic gates 102, 110, 114, 116, 120–130, and 134, counters 104 and 118, a delay element 106, flip-flops 108 and 132, a monotonicity check block 112, a lock detector 136, a phase detector 138, a charge pump 140, a loop filter 142, a VCO 144, a loop divider 146, and a digital-to-analog (D/A) converter 148. Phase detector 138, charge pump 140, loop filter 142, VCO 144, and loop divider 146 form a phase-locked loop (PLL) circuit.

Leakage current compensation circuit 100 receives a power-on reset signal and a reference clock (refclk) signal and provides, as an output signal, a final lock signal. Final lock signal is asserted when the PLL is locked, indicated by a lock signal provided by lock detector 136, and the leakage compensation process (described in further detail herein) has been completed, indicated by a trimming done signal from flip-flop 132.

Reference clock (refclk) signal provides a stable reference clock to counter 104, lock detector 136, and phase detector 138, and is also used by flip-flop 108. Reference clock (refclk) signal is used as the frequency synthesizer reference clock.

Power-on reset signal provides a signal pulse upon the initial application of power to reset certain circuits and signal parameters. Power-on reset signal, when asserted, resets counter 118, which when reset provides an output value of 128 binary from its output terminals B0–B7. Power-on reset signal also resets, through logic gate 126 (an OR gate), flip-flop 132, monotonicity check block 112, and counter 104, which when reset provides an output value of zero binary from its output terminals B0–B8.

Logic gate 126 provides a start trimming pulse signal when power-on reset signal is asserted or when lock signal from lock detector 136 is at a logical false value. Start trimming pulse signal resets various circuits, but as described above, does not reset counter 118 as when power-on reset signal is asserted. Consequently, counter 118 has its output value reset to a default (e.g., 128 binary) value only upon initial application of power. The current output value of counter 118, when PLL lock is lost and then reacquired, is probably closer to the desired value then the default output value, so counter 118 is not reset under these circumstances.

As noted above, phase detector 138, charge pump 140, loop filter 142, VCO 144, and loop divider 146 form a phase-locked loop (PLL) circuit. VCO 144 receives at its input (control voltage) terminal a leakage current compensation (Delta Icp) signal from D/A converter 148 and a charge pump current from an output (Icp) terminal of charge pump 140. VCO 144 provides a VCO clock signal from its output (vcoClk) terminal. Loop divider 146 receives VCO clock signal and provides a clock (vcoDiv) signal at its output (vcoDiv) terminal. Clock (vcoDiv) signal from loop divider 146 is at a reduced or divided clock rate than VCO clock signal and is received by phase detector 138 and lock detector 136, at their corresponding input (vcoDiv) terminal, and flip-flop 108 at its input (CLK) terminal.

Phase detector 138 receives reference clock (refClk) signal and clock (vcoDiv) signal (from loop divider 146), determines the phase or frequency difference, and provides an appropriate signal at its output terminals (labeled pumpUp and pumpDown) to corresponding input terminals on Charge pump 140. Charge pump 140 sources/sinks current into/from loop filter 142 to determine the control voltage for VCO 144.

Lock detector 136 receives clock (vcoDiv) signal (from loop divider 146) and reference clock (refclk) signal and provides, at its output (lock) terminal, lock signal. Lock signal is received by logic gate 134 (an AND gate) and logic gate 128 (a NOT gate). When lock signal is a logical false value, the combination of logic gate 128 and logic gate 126 results in start trimming pulse signal being a logical true value.

Flip-flop 108 receives reference clock (refclk) signal at its input (D) terminal and clock (vcoDiv) signal, after passing through delay element 106, at its input (CLK) terminal. Delay element 106 matches the set-up time of flip-flop 108 to provide proper timing of clock (vcoDiv) signal relative to reference clock (refclk) signal.

Flip-flop 108 provides at its Q output terminal a timing signal (labeled refClkLeadsVcoDiv), which indicates whether reference clock (refclk) signal is leading or lagging relative to clock (vcoDiv) signal. Timing signal is a logical true value or a logical false value when reference clock (refClk) signal leads or lags clock (vcoDiv) signal, respectively. Thus, flip-flop 108 functions as a timing circuit or phase detector that determines whether clock (vcoDiv) signal is leading or lagging reference clock (refClk) signal.

Counter 104 is a 9-bit "up" counter that receives a start trimming pulse signal from logic gate 126 at its reset terminal and reference clock (refClk) signal, after being inverted by logic gate 102 (a NOT gate), at its clock (clk) terminal. Counter 104 will produce a trimming pulse signal from logic gate 110 every 512 periods of reference clock (refclk) signal when start trimming pulse signal has a logical false value. Trimming pulse signal is inverted by logic gate 114 (a NOT gate) and is received by counter 118 and flip-flop 132 as a clock signal at their corresponding input (CLK) terminal. Trimming pulse signal is also received by monotonicity check block 112 as a clock signal at its input (clk) terminal.

Note that monotonicity check block 112 is clocked based on the rising edge of trimming pulse signal while counter 118 and flip-flop 132 are clocked based on the falling edge of trimming pulse signal. This allows the output signals from monotonicity check block 112 additional time to stabilize before the falling edge of trimming pulse signal triggers counter 118.

Monotonicity check block 112 monitors timing signal from flip-flop 108 to determine when the value of timing signal changes value (i.e., polarity). Monotonicity check block 112 provides an output (up) signal and an output (monotonic) signal from its corresponding output (up) terminal and output. (monotonic) terminal. Output (up) signal indicates the direction that counter 118 should count (e.g., a logical true value requires a count up) and output (monotonic) signal indicates whether the leakage current compensation requires adjustment (e.g. a logical true value if leakage current compensation is required).

Figure 2:
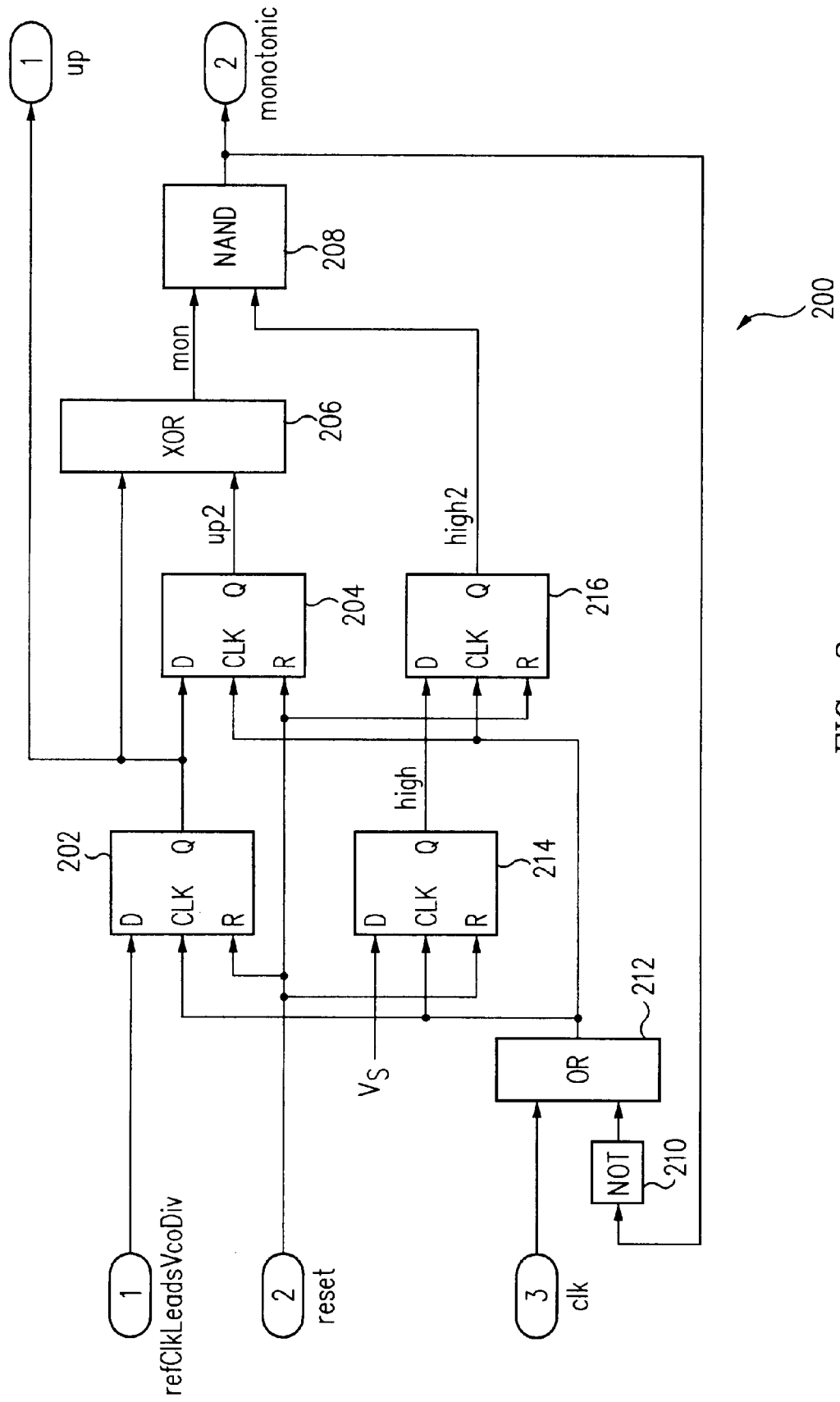
FIG. 2 shows an exemplary detailed circuit schematic for a portion of the block diagram for the embodiment shown in FIG. 1.

Referring briefly to FIG. 2, a monotonicity check circuit 200 is shown, which is an exemplary circuit for monotonicity check block 112. Monotonicity check circuit 200 includes flip-flops 202, 204, 214, and 216, and logic gates 206, 208, 210, and 212.

For monotonicity check circuit 200, after start trimming pulse signal is received at reset terminal of monotonicity check circuit 200, flip-flops 214 and 216 force output (monotonic) signal to be a logical true from the first clock pulse received at its clock (clk) terminal to the second clock pulse. Output (high2) signal from a Q output terminal of flip-flop 216, being a logical false value, forces output (monotonic) signal to be a logical true value until two samples (current and previous) of timing signal (from flip-flop 108, labeled refClkLeadsVcoDiv) can be obtained. After two clock pulses are received by flip-flops 214 and 216, output (high2) signal will be a logical true value due to a logical high signal value (represented by Vs in FIG. 2) provided at a D input terminal of flip-flop 214.

On the first clock pulse received at clock (clk) terminal, flip-flop 202, which provides output (up) signal from its Q terminal, loads the current status of timing signal from flip-flop 108. At the second clock pulse received at clock (clk) terminal, flip-flop 202 loads the present status of timing signal while flip-flop 204, which provides an output (up2) signal from its Q terminal, loads the previous status of timing signal (provided by output (up) signal from Q terminal of flip-flop 202).

Logic gate 206 (an exclusive OR gate) receives output (up) signal from flip-flop 202 and output (up2) signal from flip-flop 204 and provides an output (mon) signal. If the present and previous status of timing signal are the same, output (mon) signal is a logical low and output (monotonic) signal from logic gate 208 (a NAND gate) remains a logical high. Once output (mon) signal becomes a logical high (present and previous polarity of timing signal values differ), then logic gate 208 provides a logical low signal for output (monotonic) signal, which indicates the completion of the leakage compensation process (described in further detail herein).

Once output (monotonic) signal from logic gate 208 transitions to a logical low value, the clock signal for flip-flops 202, 204, 214, and 216 is forced to a logical high value by logic gate 212 (an OR gate) and logic gate 210 (a NOT gate). Thus, the clock signal for these flip-flops will remain at a logical high value, regardless of the signal value received at clock (clk) input terminal of monotonicity check circuit 200, until start trimming pulse signal is asserted and received at reset terminal of monotonicity check circuit 200. The assertion of start trimming pulse signal indicates that the leakage compensation process must begin or restart.

Output (mon) signal is not the final indication of monotonicity, because output (up2) signal from flip-flop 204 is initially set to zero (due to receipt of start timing pulse signal) at the first pulse received at clock (clk) terminal. Thus, if timing signal from flip-flop 108 was a logical true value, then output (mon) signal from logic gate 206 would be a logical true value despite the fact that the calibration process has not been responsible for the change of status in timing signal. Rather, a transient due to the initial condition of flip-flop 204 would have been responsible.

Returning to FIG. 1, counter 118 receives output (up) signal at its input (up_down) terminal and an enable signal, at its input (en) terminal, from logic gate 116 (an AND gate). Enable signal is a logical true value if a keep counting signal and output (monotonic) signal are at a logical true value. Enable signal, when asserted, enables counter 118 to count up or down based on the polarity of output (up) signal.

Counter 118 provides an output signal value at its output terminals B0–B7 that is received at corresponding input terminals B0–B7 of D/A converter 148 and is also received by logic gate 120 (an AND gate) and logic gate 122 (a NOR gate). Logic gate 124 (a NOR gate) receives an output (maxAndUp) signal from logic gate 120 and an output (minAndDown) signal from logic gate 122 and provides keep counting signal to logic gate 116.

Output (maxAndUp) signal is a logical true value if output terminal B0–B7 and output (up) signal are a logical true value. Output (minAndDown) signal is a logical true value if output terminal B0–B7 and output (up) signal are a logical false value. Thus, keep counting signal from logic gate 124 is a logical true value unless output (minAndDown) signal or output (maxAndUp) signal is a logical true value. When keep counting signal is a logical false value, this indicates that counter 118 has reached its counter limits.

D/A converter 148, based on the output signal value provided by counter 118, provides the appropriate value for leakage current compensation (Delta Icp) signal from its output (Delta Icp) terminal. For example, D/A converter 148 is an 8-bit digital-to-analog converter (DAC) whose output current is 20 nA injected into loop filter 142 for a binary input value (from counter 118) of 128. The DAC range may be –2.54 uA (for a zero binary input value) to 2.56 uA (for a 255 binary input value), with a resolution of 20 nA (i.e., 1 LSB of counter 118).

A negative value for leakage current compensation (Delta Icp) signal indicates that current is being received from a node 150 (also labeled vc in FIG. 1), at the terminals of loop filter 142, by D/A converter 148 to compensate for the leakage current. A positive value for leakage current compensation (Delta Icp) signal indicates that current is being supplied to node 150 by D/A converter 148 to compensate for the leakage current.

In general, Leakage current compensation circuit 100 monitors clock (vcoDiv) signal from loop divider 146 and compares it to the reference clock (refClk) signal to determine whether leakage current exists. If leakage current is flowing out of node 150 (e.g., out of loop filter 142), the voltage level at input (control voltage) terminal of VCO 144 will decrease, resulting in the VCO frequency of VCO 144 to decrease. Because the PLL has to sustain the desired frequency, the PLL responds to the discharging filter by developing a pump-up signal (i.e., reference clock (refClk) signal leading clock (vcoDiv) signal) that forces node 150 to have the average voltage value that VCO 144 needs to generate the desired frequency at its output.

Alternatively, if leakage current is flowing into node 150 (e.g., into loop filter 142), the voltage level at input (control voltage) terminal of VCO 144 will increase, resulting in the VCO frequency of VCO 144 to increase. Consequently, the PLL responds to the charging filter by developing a pump-down signal at the output of phase detector 138 so that the average voltage value at node 150 is at the desired value. Thus, by monitoring reference clock (refClk) signal relative to clock (vcoDiv) signal, the polarity of the leakage current can be determined and compensation can be provided.

In terms of general circuit operation for leakage current compensation circuit 100, lock detector 136 monitors the PLL and asserts lock signal when the PLL is locked. Until lock signal is asserted, start trimming pulse signal maintains the leakage compensation circuitry in a reset condition. Once start trimming pulse signal is no longer asserted, the leakage current compensation begins.

Counter 104 causes the assertion of trimming pulse signal every 512 periods of reference clock. Monotonicity check block 112 compares the polarity of timing signal from flip-flop 108 and, if the polarities are the same, determines whether counter 118 must count up or down to adjust leakage current compensation (Delta Icp) signal from D/A converter 148.

If the polarities of timing signal are different, this indicates that reference clock (refClk) signal has passed from leading to lagging or lagging to leading clock (vcoDiv) signal. This indicates that the leakage current compensation is completed and correct within 1 LSB of counter 118. The value of output (monotonic) signal from monotonicity check block 112 becomes a logical false value, causing enable signal to be a logical false value. Final lock signal then becomes a logical true value, because trimming done signal from flip-flop 132 becomes a logical true value.

The PLL is stable at this point because counter 118 has not changed (i.e., no change in leakage current compensation has occurred) for at least 512 reference clock periods. With the addition of the leakage current compensation, the phase offset between reference clock (refClk) signal and clock (vcoDiv) signal for the PLL has been reduced.

The final result of leakage current compensation circuit 100 is the application of leakage current compensation (Delta Icp) signal into loop filter 142, which results in a reduction of frequency spurs and phase offset for the PLL. A computer simulation program (MathCad) was utilized to determine the transient response of a second order PLL to a current step at the loop filter of the PLL. The current step represents the application of leakage current compensation (Delta Icp) signal to the PLL, as described above for FIG. 1, which results in a revised phase offset.

Figure 3:
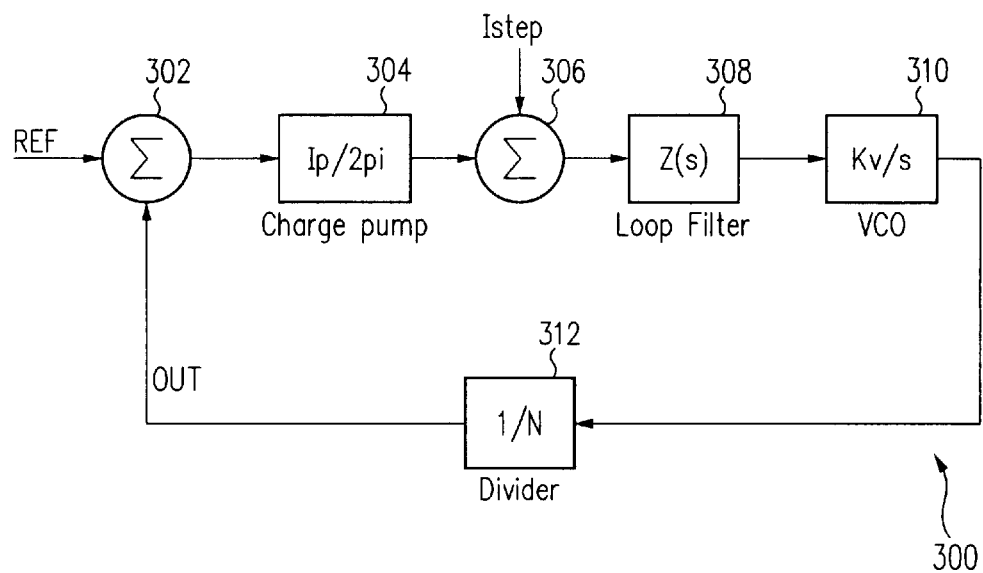
FIG. 3 illustrates a phase-locked loop block diagram in accordance with an embodiment of the present invention.

FIG. 3 illustrates a phase-locked loop block diagram 300, in accordance with an embodiment of the present invention, which was used for the computer simulation. PLL block diagram 300, shown in the S-domain, includes summers 302 and 306, a charge pump 304, a loop filter 308, a VCO 310, and a divider 312. An input signal REF is the reference clock signal and input signal Istep is the current step signal.

Figure 4:
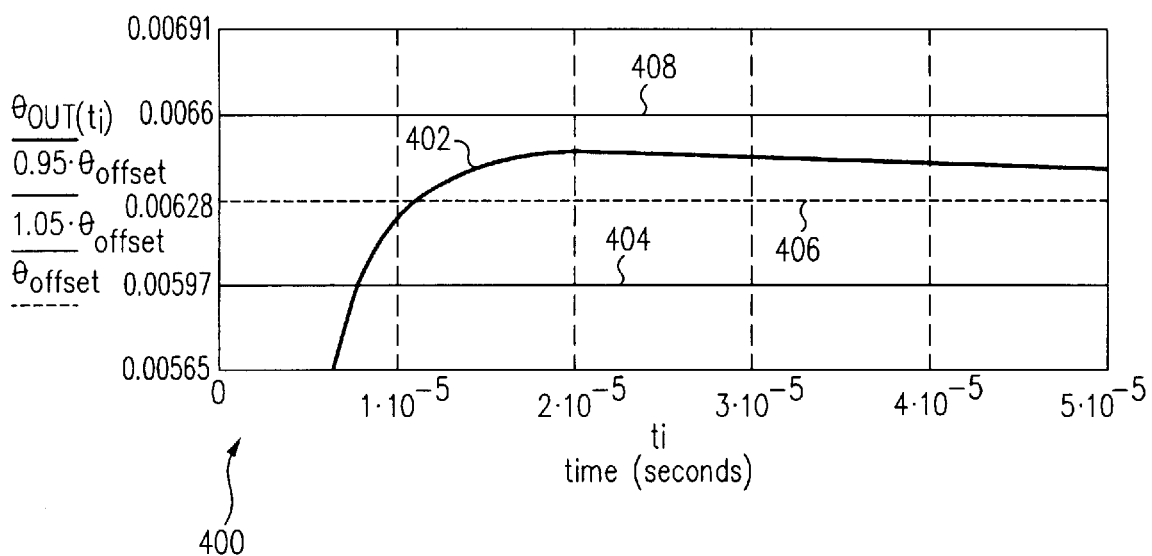
FIG. 4 illustrates a plot of phase offset for the phase-locked loop block diagram of FIG. 3.

FIG. 4 illustrates a plot 400 of phase offset versus time for phase-locked loop block diagram 300 of FIG. 3. Plot 400 shows the response of phase offset to a current step at the loop filter introduced at a time of zero seconds. As can be seen in plot 400, a phase offset signal 402 is within five percent (i.e., within a 0.95 phase offset line 404 and a 1.05 phase offset line 408 of a phase offset line 406) of its final value within approximately 10 usecs.

The computer simulation MathCad file entitled "Transient Response of a Second Order PLL to a Current Step at the Loop Filter" is provided below. The simulation shows that a current step (positive or negative) at the filter node will result in a given phase offset. For example, a 20 nA compensating current reduces the static phase offset by 0.00628 radians (0.36 degrees or 37 psec for a 27 MHz reference clock). The required time to settle to within five percent of its final value is around 10 usec. This allows sufficient time, for example, for trimming pulse signal from counter 104 of FIG. 1 that pulses every 512 reference clock (refclk) signal periods (i.e., 18.96 usecs), because it is more than the minimum 10 usecs required by the PLL to settle, based on the simulation results.

Figure 5A:
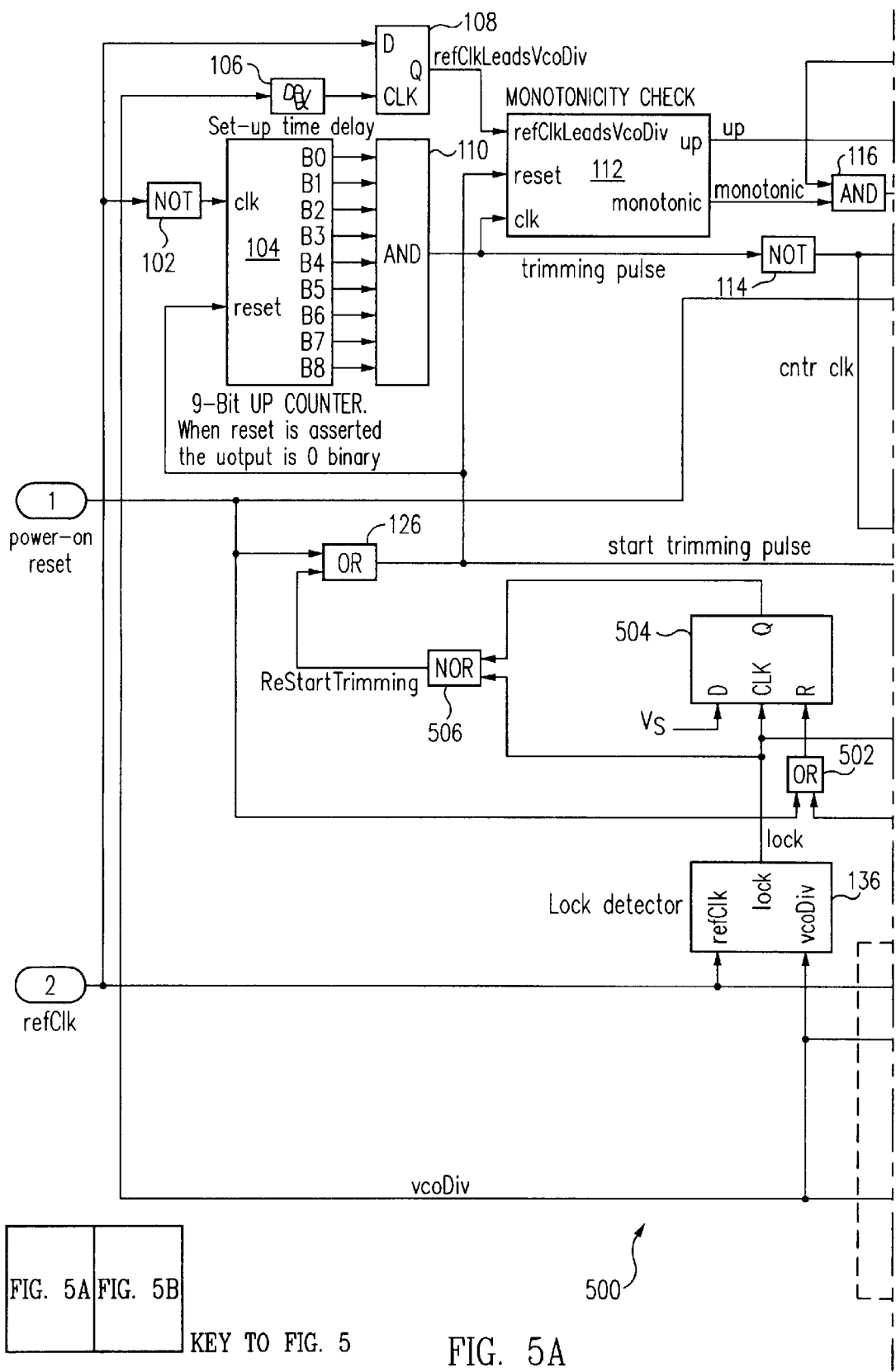
FIG. 5 illustrates a block diagram illustrating a leakage current compensation circuit for a frequency synthesizer in accordance with a second embodiment of the present invention.
Figure 5B:
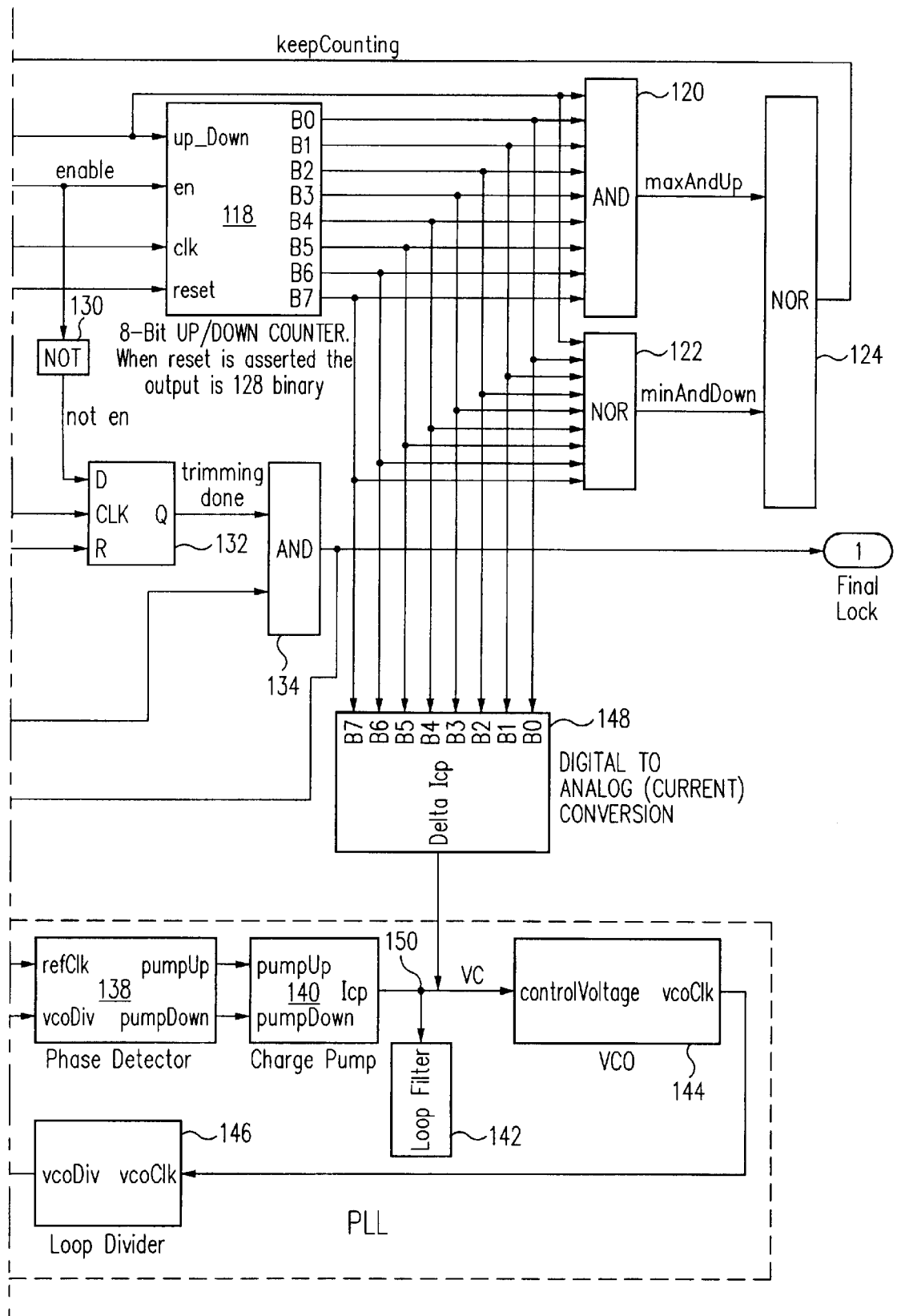

Leakage current compensation (Delta Icp) signal from D/A converter 148 will generally not cause lock detector 136 to indicate that the PLL has lost lock (i.e., lock signal will remain a logical true value during changes in leakage current compensation (Delta Icp) signal values). However, if larger changes in leakage current compensation are required, FIG. 5 shows a block diagram illustrating a leakage current compensation circuit 500 for a frequency synthesizer in accordance with a second embodiment of the present invention.

Leakage current compensation circuit 500 is similar to leakage current compensation circuit 100 and therefore, the general circuit operation and description of identically numbered circuit elements will not be repeated. Leakage current compensation circuit 500 includes logic gates 502 and 506 and a flip-flop 504.

Flip-flop 504 receives lock signal from lock detector 136 at its clock (clk) input terminal, a logical high signal value (labeled Vs in FIG. 5) at its input (D) terminal, and the output from logic gate 502 (an OR gate) at its reset (R) input terminal. Logic gate 502 receives power-on reset signal and final lock signal, while logic gate 506 (a NOR gate) receives lock signal and a Q output signal from an output (Q) terminal of flip-flop 504. Logic gate 506 provides a restart trimming (ReStart Trimming) signal to logic gate 126.

When power-on reset signal is asserted (i.e., pulsed), logic gate 502 resets flip-flop 504. Lock signal from lock detector 136 and Q output signal from flip-flop 504 are at a logical low signal value, which causes restart trimming signal from logic gate 506 and start trimming pulse signal from logic gate 126 to be at a logical high signal value. Thus, leakage current compensation circuit 500 does not perform any leakage current compensation (Delta Icp) signal adjustments.

When Lock signal transitions to a logical true signal value, Q output signal from flip-flop 504 becomes a logical true signal value along with restart trimming signal and start trimming pulse signal. Leakage current compensation circuit 500 then monitors the PLL as described above for FIG. 1 and adjusts the leakage current compensation (Delta Icp) signal value. During this period, lock signal may toggle in value, but the leakage current compensation will continue because Q output signal remains at a logical high signal value forcing restart trimming signal and start trimming pulse signal to a logical low signal value.

Once the leakage current compensation process is completed, trimming done signal from flip-flop 132 will transition to a logical high signal value. Final lock signal will transition to a logical high signal value (if lock signal becomes a logical high signal value), which resets flip-flop 504. The leakage current compensation process does not make further leakage current compensation (Delta Icp) signal adjustments because monotonicity check block 112 forces enable signal to a logical false signal value (as described above) at the completion of the leakage current compensation process.

If the PLL loses lock after completion of the leakage current compensation process, lock signal will transition to a logical low signal value, resulting in restart trimming signal and start trimming pulse signal to become a logical high signal value. Consequently, the leakage current compensation circuit 500 will restart once the PLL locks and lock signal is a logical high signal value again.

Charge pump leakage current compensation systems and methods are disclosed herein. The charge pump leakage current compensation architecture reduces frequency spurs and phase offset in a frequency synthesizer by determining and compensating for the leakage current at the loop filter terminal.

Embodiments described above illustrate but do not limit the invention. It should be understood that numerous modifications and variations are possible in accordance with the principles of the present invention. Accordingly, the scope of the invention is defined only by the following claims.

TRANSIENT RESPONSE OF A SECOND ORDER PLL TO A CURRENT STEP AT THE LOOP FILTER

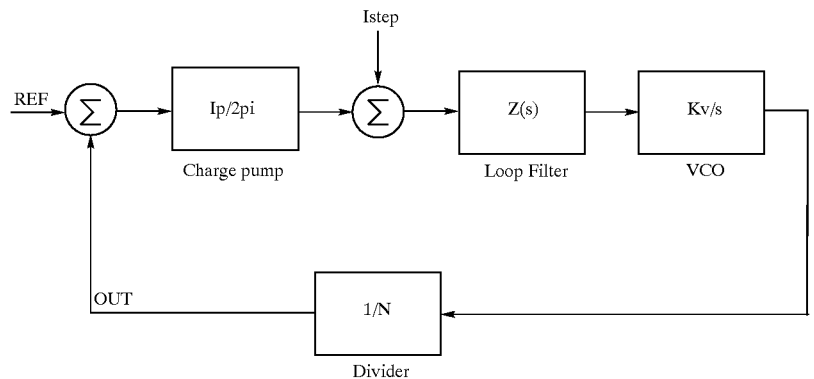

s-domain PLL block diagram

Parameter Definition:

$\Delta I := 20 \cdot 10^{-9}$  Current step (Istep) in Amperes.

$I_p := 20 \times 10^{-6}$  Charge pump current in Amperes.

$Z(s) = R + \dfrac{1}{s \cdot C}$  Impedance of the loop filter.

$R := 2000$  Resistor of the loop filter in Ohms.

$C := 50 \cdot 10^{-9}$  Capacitor of the loop filter in Farads.

$K_v := 200 \cdot 10^6 \cdot 2 \cdot \pi$  VCO gain in radians/(second * Volt)

$N := 24$  Loop divider.

Finding the Output Phase/Current Step Transfer Function:

$$\left[(\theta_{REF}(s) - \theta_{OUT}(s)) \cdot \dfrac{I_p}{2 \cdot \pi} + I_{step}(s)\right] \cdot Z(s) \cdot \dfrac{K_v}{s} \cdot \dfrac{1}{N} = \theta_{OUT}(s)$$

Since the phase of the reference is constant in our analysis we can make it zero. Then, $$\left[-\theta_{OUT}(s)\right] \cdot \dfrac{I_p}{2 \cdot \pi} + I_{step}(s)] \cdot Z(s) \cdot \dfrac{K_v}{s} \cdot \dfrac{1}{N} = \theta_{OUT}(s)$$

$I_{step}(s) =$ $$\dfrac{\theta_{OUT}(s)}{Z(s) \cdot \dfrac{K_v}{s} \cdot \dfrac{1}{N}} + \theta_{OUT}(s) \cdot \dfrac{I_p}{2 \cdot \pi} = \theta_{OUT}(s) \cdot \left[\dfrac{1}{\left(Z(s) \cdot \dfrac{K_v}{s} \cdot \dfrac{1}{N}\right)} + \dfrac{I_p}{2 \cdot \pi}\right]$$

$$\dfrac{\theta_{OUT}(s)}{I_{step}(s)} = \dfrac{1}{\left[\dfrac{1}{\left(Z(s) \cdot \dfrac{K_v}{s} \cdot \dfrac{1}{N}\right)} + \dfrac{I_p}{2 \cdot \pi}\right]} =$$

$$\dfrac{2 \cdot \pi}{I_p} \cdot \dfrac{1}{\left[\dfrac{1}{\left(\dfrac{I_p}{2 \cdot \pi} \cdot Z(s) \cdot \dfrac{K_v}{s} \cdot \dfrac{1}{N}\right)} + 1\right]} = \dfrac{2 \cdot \pi}{I_p} \cdot \dfrac{1}{\dfrac{1}{G(s)} + 1} = \dfrac{2 \cdot \pi}{I_p} \cdot H(s)$$

Defining the Following Terms, $$\omega_n := \sqrt{\dfrac{K_v \cdot I_p}{2 \cdot \pi \cdot C \cdot N}} \quad \zeta := \dfrac{R \cdot C}{2} \cdot \omega_n \quad \zeta = 2.887$$

$$H(s) = \dfrac{2 \cdot \zeta \cdot \omega_n \cdot s + \omega_n^2}{s^2 + 2 \cdot \zeta \cdot \omega_n \cdot s + \omega_n^2}$$

If $I_{step}(t) = \Delta I \cdot u(t)$ then $I_{step}(s) = \dfrac{\Delta I}{s}$ $$\theta_{OUT}(s) = 2 \cdot \pi \cdot \dfrac{\Delta I}{I_p} \cdot \dfrac{2 \cdot \zeta \cdot \omega_n \cdot s + \omega_n^2}{s \cdot (s^2 + 2 \cdot \zeta \cdot \omega_n \cdot s + \omega_n^2)}$$

Applying the Inverse Laplace Transform to Obtain the Time Domain Expression, $$A(t) := \dfrac{1}{\omega_n^2} \cdot \dfrac{\exp(-\zeta \cdot \omega_n \cdot t)}{[(\zeta - 1) \cdot (\zeta + 1)]} \cdot$$
$$(\omega_n^2 - \zeta^2 \cdot \omega_n^2)^{(\frac{1}{2})} \cdot \zeta \cdot \sin\left[[-\omega_n^2 \cdot (\zeta - 1) \cdot (\zeta + 1)]^{(\frac{1}{2})} \cdot t\right]$$

$$B(t) := \dfrac{1}{\omega_n} \cdot \dfrac{\exp(-\zeta \cdot \omega_n \cdot t)}{[(\zeta - 1) \cdot (\zeta + 1)]} \cdot \cos\left[[-\omega_n^2 \cdot (\zeta - 1) \cdot (\zeta + 1)]^{(\frac{1}{2})} \cdot t\right]$$

$$C(t) := \dfrac{1}{\omega_n} \cdot \dfrac{\exp(-\zeta \cdot \omega_n \cdot t)}{[(\zeta - 1) \cdot (\zeta + 1)]} \cdot \zeta^2 \cdot \cos\left[[-\omega_n^2 \cdot (\zeta - 1) \cdot (\zeta + 1)]^{(\frac{1}{2})} \cdot t\right]$$

$$\theta_{OUT}(t) := 2 \cdot \pi \cdot \dfrac{\Delta I}{I_p} \cdot \omega_n \cdot \left(\dfrac{1}{\omega_n} - A(t) + B(t) - C(t)\right)$$

Time for the Phase of the Output to be Within 5% of its Final Value After the Step:

The steady state phase offset caused by $\Delta 1$ at the loop filter is, $$\Delta I \cdot 2 \cdot \pi = I_p \cdot \theta_{offset}$$

$$\theta_{offset} := 2 \cdot \pi \cdot \dfrac{\Delta I}{I_p}$$

Plotting Variables:

$$N_p := 100 \quad i := 0 \ldots N_p \quad t_{end} := 50 \cdot 10^{-6} \quad t_i := \dfrac{t_{end}}{N_p} \cdot i$$

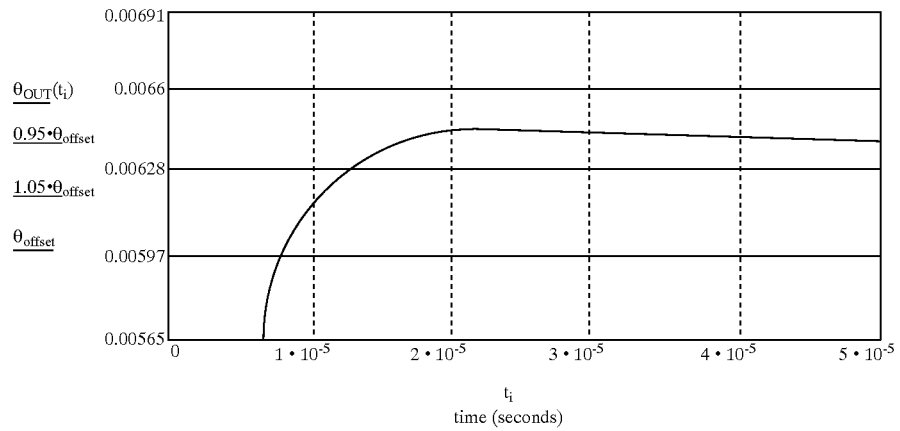

Output phase as a response to a current step at the loop filter at time 0. The phase is within 5% of its final value after 10 uSec.

What is claimed is:

1. A leakage current compensation circuit, comprising:
   a frequency synthesizer;
   a timing circuit coupled to the frequency synthesizer, the timing circuit receiving a clock signal from the frequency synthesizer and providing a timing signal indicating the timing of the clock signal relative to a reference clock signal;
   a counter coupled to the timing circuit, the counter providing a counter output value based on a value of the timing signal; and
   a digital-to-analog converter coupled to the counter and to the frequency synthesizer, the digital-to-analog converter receiving the counter output value and providing a leakage current compensation signal to the frequency synthesizer based on the counter output value.

2. The circuit of claim 1, further comprising a second counter coupled to the counter, the second counter providing a clock to the counter.

3. The circuit of claim 1, further comprising a monotonicity check circuit coupled between the counter and the timing circuit, the monotonicity check circuit enabling the counter based on a prior and a current value of the timing signal from the timing circuit.

4. The circuit of claim 1, further comprising a lock detector coupled to the frequency synthesizer, the lock detector providing a lock signal to the circuit indicating when the frequency synthesizer is locked.

5. The circuit of claim 4, further comprising a final lock circuit coupled to the lock detector and to the counter, the final lock circuit indicating when the frequency synthesizer is locked and leakage current compensation has been completed.

6. The circuit of claim 1, wherein the frequency synthesizer is a phase-locked loop circuit.

7. A leakage current compensation circuit, comprising:
   a frequency synthesizer;
   means for monitoring the frequency synthesizer; and
   means for providing a leakage current compensation signal to the frequency synthesizer based on the monitoring to reduce the phase offset of the frequency synthesizer.

8. The circuit of claim 7, further comprising means for indicating when the frequency synthesizer is locked and the leakage current compensation has been completed.

9. A method of compensating for leakage current in a frequency synthesizer, the method comprising:
   monitoring a frequency synthesizer to determine when the frequency synthesizer is locked;
   determining a phase offset of the frequency synthesizer relative to a reference clock, when the frequency synthesizer is locked; and
   supplying a leakage current compensation signal to the frequency synthesizer based on the determining of the phase offset.

10. The method of claim 9, further comprising maintaining a value of the leakage current compensation signal when the determining of the phase offset indicates that a clock of the frequency synthesizer transitions from leading to lagging or lagging to leading relative to the reference clock.

* * * * *